United States Patent [19]
McKee

[11] 3,963,293
[45]* June 15, 1976

[54] ELECTRICAL EDGE CONNECTOR

[75] Inventor: William H. McKee, West Covina, Calif.

[73] Assignee: TRW Inc., Cleveland, Ohio

[45] *Notice: The portion of the term of this patent subsequent to June 15, 1993 has been disclaimed

[22] Filed: June 28, 1971

[21] Appl. No.: 157,167

[52] U.S. Cl. ........................ 339/17 L; 339/176 MP
[51] Int. Cl.$^2$ ........................ H05K 1/07
[58] Field of Search ............ 339/17 R, 17 L, 17 LC, 339/17 LM, 119 R, 125 R, 126 R, 176 MF, 176 MP, 221

[56] References Cited

UNITED STATES PATENTS

| | | | |
|---|---|---|---|
| 3,015,083 | 12/1961 | Juris | 339/176 MP |
| 3,260,982 | 7/1966 | Bostwick | 339/17 LM |
| 3,325,770 | 6/1967 | Hammell et al. | 339/221 M |
| 3,327,284 | 6/1967 | Crimmins | 339/17 R |
| 3,328,749 | 6/1967 | Kukla | 339/221 R |
| 3,428,934 | 2/1969 | Reider et al. | 339/275 R X |
| 3,464,054 | 8/1969 | Mansfield | 339/217 R |
| 3,530,422 | 9/1970 | Goodman | 339/17 L |
| 3,579,176 | 5/1971 | Boker et al. | 339/176 MP |
| 3,614,706 | 10/1971 | Kukla | 339/176 MP |
| 3,624,586 | 11/1971 | Inacker | 339/176 MP X |
| 3,671,917 | 6/1972 | Ammon et a. | 339/17 L |
| 3,696,323 | 10/1972 | Kinkaid et al. | 339/17 C X |
| 3,783,433 | 1/1974 | Kurtz et al. | 339/176 MP |

FOREIGN PATENTS OR APPLICATIONS

| | | | |
|---|---|---|---|
| 1,475,962 | 2/1967 | France | 339/217 S |
| 1,815,041 | 6/1970 | Germany | 317/101 DH |
| 1,171,622 | 11/1969 | United Kingdom | 339/176 MP |
| 1,070,574 | 6/1967 | United Kingdom | 339/176 MP |

OTHER PUBLICATIONS

C. P. Hill et al. "Low Voltage Pluggable Connector," IBM Tech. Disclosure, May 1966, vol. 8, No. 12 p. 1725.

*Primary Examiner*—Lawrence J. Staab
*Attorney, Agent, or Firm*—Lawrence S. Cohen

[57] ABSTRACT

An electrical edge connector assembly for use in conjunction with a printed circuit board, consisting of a connector element having a base portion which is removeably secured to a printed circuit board, a contact blade connected to the base portion and an insulator casting, wherein the base portion may be secured to a printed circuit board and the insulator casting installed over the connector element and wherein upon insertion of the contact blade into the insulator casting said blade is adapted to securely hold the insulator casting to the printed circuit board and wherein the casting provides means for individually insulating a plurality of connector elements and protects the individual connector elements from physical distortion in use. In one form the connector element may be withdrawn from the top of the insulator casting.

12 Claims, 8 Drawing Figures

Inventor
WILLIAM H. McKEE
By John Todd

ELECTRICAL EDGE CONNECTOR

BACKGROUND OF THE INVENTION

1. Field of the Invention

The present invention relates to an electrical connector assembly and a electrical connector element for use with a printed circuit board wherein the connector element or contact is removably secured to the printed circuit board and wherein each connector element is individually insulated by an insulator casting. In one particular, the invention relates to a connector assembly of this type in which a plurality of connector elements are included and which may enter the insulator casting from the top or bottom.

2. History of the Prior Art

It is well known that there are many methods of employing electrical connectors and connecting elements in operative relationship with printed circuit boards. Some methods involve permanent attachment of a connector element and the connector to the board. However, there are times when it is desirable to remove the connector from the board to interrupt a portion of the circuit and for this reason a permanent attachment may be undesirable. Other methods involve the use of connector elements (commonly and herein also referred to as contacts) permanently secured within an insulating casting. Replacement of damaged connector elements in this type of assembly is difficult or impractical.

It should be noted that connector elements may frequently become distorted or broken thereby disabling the connector circuit. Also an assembly with permanent connector elements physically exposed may give rise to problems of electrical shorting. Another problem is that these connector elements commonly are not separately insulated since during the process of securing them to the circuit board such as by welding the heat generated would be destructive of the synthetic insulating materials commonly available.

In those instances where electrical connector elements are disposed in an insulating casting some functional characteristics of use are involved which require careful attention in utilization of the component. For example, it is well known that materials from which insulating castings commonly are made have relatively low melting points. If leads are to be soldered to connector elements soldering temperatures of 500°F to 700°F may be realized. Temperatures of this order extend into the softening or destructive range of materials used in making insulating castings. It can readily be seen that a severe functional limitation is placed on any assembly of casting and connector elements.

Where reliability in circuit continuity is important in electronic devices it always is desirable to have a secure connection defined at circuit junctions. This commonly is realized by soldering such junctions to define positive mechanical and electrical connection.

However, a limitation is imposed where contact elements are joined to circuit boards if the elements are disposed in an insulating casting since the casting may soften or melt during soldering. For this reason, when contact elements are to be soldered to a circuit board they commonly are not provided with the protection of an insulating casting. The present invention is intended, in part, to provide a structure which permits soldering and also provides protective insulation for the contact elements.

The present invention also relates to an improved electrical connector assembly for use with a printed circuit board where the connector element may be easily removed from the circuit board and yet be capable of providing good electrical and mechanical connection and will securely hold the mating insulator casting to the printed circuit board. This connector element may easily be mechanically inserted and removed from the mating insulator casting and provides a simple means of economically achieving mechanical and electrical connection.

SUMMARY OF THE INVENTION

The electrical connector assembly of the present invention defines simple, positive means of locking connector elements to a mating insulator casting. The electrical connector assembly of one embodiment of the present invention also permits individual removal of connector elements for modification of the circuitry by removing the connector element from the base of the printed circuit board. Also, when a connector element of the assembly is physically distorted in use the element may be easily removed from the casting and circuit board thereby eliminating the necessity of either discarding the total circuit board or attempting to physically adjust the distorted connector element.

The present invention is generally intended to overcome deficiencies of the prior art by providing an electrical connector assembly adapted to be used with printed circuit boards, having removeable electrical connector elements eliminating the necessity of discarding the complete circuit board or connector wherever a connector element is physically distorted or when a change or modification in the circuitry is desired; and where an insulator casting is provided to ensure insulation and good mechanical and electrical connection to a mating connector and such method of attaching the connector element eliminating the danger of heat destruction of the insulator casting during soldering of the connector element to the printed circuit board.

It is, accordingly, a general object of the present invention to provide an improved electrical connector element and assembly for use with printed circuit boards.

Other objects of the present invention reside in the provision of an improved electrical connector element that is removeable from the printed circuit board to permit modification of the circuitry if desired; to remove physically distorted connector elements while avoiding discarding the total printed circuit board; in the provision of an improved electrical connector element that requires no tools to secure or remove the insulator casting from the connector element; the provision of an insulator casting that may be easily attached or removed; where the problems associated with the other devices used with permanently fixed connector assemblies printed circuit boards are either eliminated or minimized; and where the electrical connector assemblies are easy to use, durable and economical to manufacture.

The novel features which are believed to be characteristic of this invention are set forth with particularity in the appended claims. The invention itself, however, together with further objects and advantages thereof, will best be understood by reference to the following descriptions taken in connection with the accompanying drawings, in which:

Figure 1:
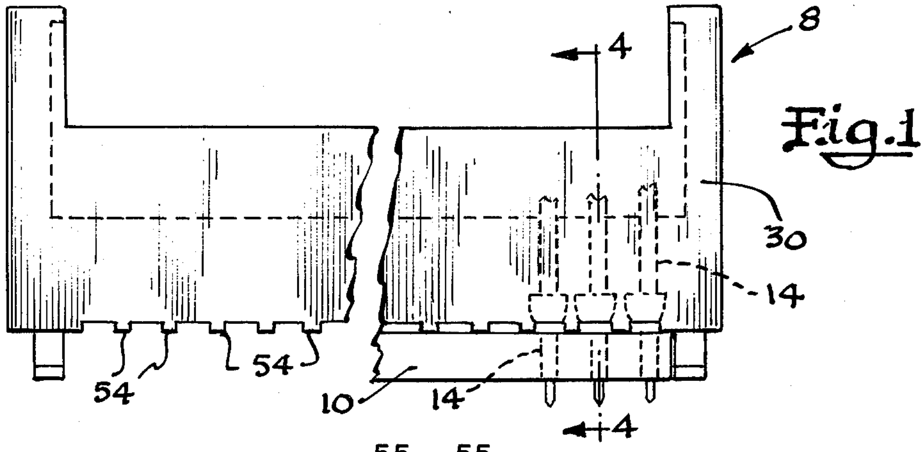
FIG. 1 is a side view of the electrical connector element and insulator casting in assembly.

The electrical connector assembly of the present invention is indicated generally at 8 in FIG. 1, and includes a printed circuit board 10, electrical connector elements 14, and an insulator casting 30. The printed circuit board 10, best seen in FIG. 4, has circuit means defined on the lower face 10*b* of board 10. It should be noted, however, that circuit means could be provided on both sides of the board. Openings 11 extend through the board 10. The term connector when used above herein refers to the connector elements 14 and the insulator casting 30 as a unit. The connector assembly includes the printed circuit board 10.

Figure 5:
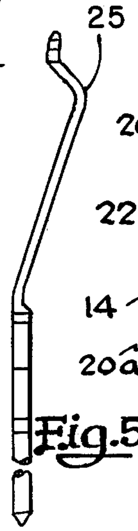
FIG. 5 is a side view of the electrical connector element in detail.
Figure 6:
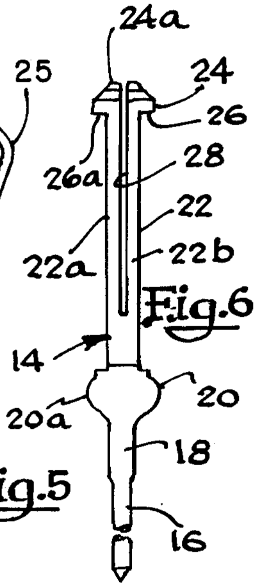
FIG. 6 is a front view of the connector element of FIG. 5.

The electrical connector element 14, best seen in FIGS. 5 and 6, is defined by a central base 18 extending into the neck 16 with a shoulder 20 defined on the opposed end. The central base 18 is adapted to be press fitted into the opening 11 of board 10. Connected to the other side of shoulder 20 is a blade section 22 that terminates in a tail element 24 and 24*a* having ears 26 and 26*a* extending to opposite sides of the connector element best seen in FIG. 6. The blade 22 is angularly disposed away from the longitudinal axis of the central base 18 and shoulder 20, best seen in FIG. 5, causing the blade 22 to be bent away from the longitudinal axis of central base 18. Just before the tail element 24, there is a bend in the blade 22, back toward the longitudinal axis of the central base 18 defining a convex contact engaging surface 25. The blade 22 also has a central opening 28 extending axially from the tail element 24 along the major length of blade 22. The central opening 28 splits the blade 22 into two blade sections 22*a* and 22*b* (and two tail elements 24, 24*a*), respectively, to provide bifurcated redundant contact.

Figure 8:
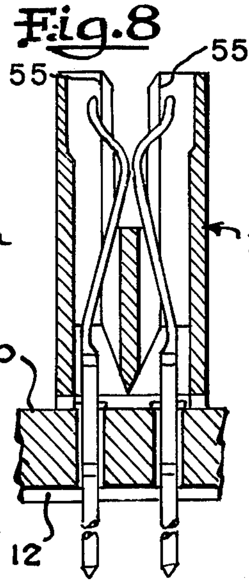
FIG. 8 is a cross-section of the assembly of FIG. 1 showing the complete connector assembly.

The insulator casting 30 comprises an insulator normally formed to provide two parallel rows of electrical contacts, the contacts of one row being opposed to the contacts in the other row. The insulator casting has body 31 having a central chamber 32 terminating at one end in a lower opening 36 and at the other end in an upper opening 34. The lower opening 36 is adapted to receive the tail element 24, blade 22 and shoulder 20 with shoulder 20 in contact with the sides 52, 52A of the chamber 32 for frictional engagement of connector element 14 as further described below. FIG. 8 shows the assembly of connector element 14 and the insulator casting 30. This insures that once the insulator casting 30 is mounted on connector element 14, it will be securely held to connector element 14.

Figure 4:
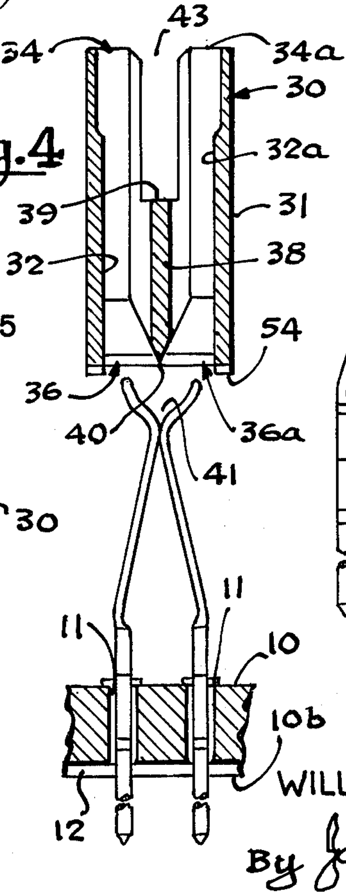
FIG. 4 is a partial cross-section of the connector assembly taken along lines 4—4 of the assembly of FIG. 1 showing the insulator casting in position to be installed over the connector elements.

The upper opening 34 of central chamber 32 is adapted to receive edgewise a mating printed circuit board the specific configuration of which is not a part of the present invention. The preferable arrangement of the connector elements 14 is to have two such elements 14 facing each other as illustrated in FIG. 4. However, the device will work equally well with one connector element 14. The connector may be provided with a projection for the purpose of conveniently spreading apart the face-to-face connector element 14 as it is inserted. This is explained in further detail below.

Figure 7:
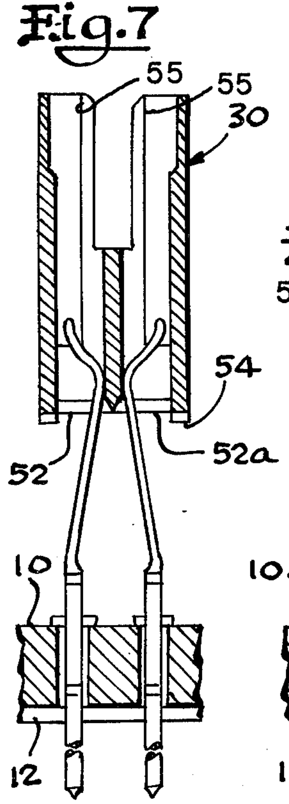
FIG. 7 is a cross-section of the assembly of FIG. 1 taken along lines 4—4, showing the insulator casting being installed and spreading the connector elements apart.

The insulator casting 30 has a central projection 38 separating the central chambers 32 and 32*a*. One end of central projection 38 is disposed toward the openings 36 and 36*a* and terminates in a tapered nose 40 to permit the central projection 38 to slide easily between opening 41 defined between the tail elements 24 and 24*a* of blades 22 and 22*a*, respectively, as shown in FIG. 7. The central projection 38 extends up to edge 39. The edge 39 of central projection 38 and central chambers 32*a* and 32 define a projecting opening 43 for close fitting relation with the mating printed circuit board.

Referring sequentially to FIGS. 4, 7 and 8, in assembling the electrical connector element 14 and insulator casing 30, the neck 16 of connector element 14 is inserted through the opening 11 of circuit board 10 until the central base 18 is in press fit relation with the walls of opening 11. The connector elements thus inserted then may be soldered to the circuit means 12 by passing them through a wave soldering machine where the temperature may reach between 500°F to 700°F. This temperature is within the softening or destructive range for the synthetic materials used in making the insulator casting 30. After the connector elements are soldered to the printed circuit 12, the insulator casting 30 is then mounted on the connector elements 14, as shown in FIGS. 4, 7, and 8, by pushing the insulator casting 30 over the tail elements 24. During this pushing the central projection 28 will spread the blades 22 apart and force the casting walls 52 and 52*a* into a tight-fit relation with the shoulders 20 and 20*a*, respectively, of connector element 14. This frictional engagement will securely hold the insulator casting 30 in positive relation to the printed circuit board 10. The insulator casting 30 is pushed all the way down until separating protusions 54 extending from the bottom face of insulator casting 30 contact the upper surface 10a of circuit board 10. As the insulator casting 30 is pushed downward, the convex contact surface 25 passes the edge 39 of the projection 38. When this point is reached the spring biased tail elements 24 and 24*a* of blades 22 and 22a, respectively, will spring toward each other. The assembly of circuit board 10, connector elements 14 and insulator casting 30 is then in a position of readiness to accept a mating printed circuit board. Being in this position the insulator casting 30 also prevents the blades 22 and 22*a* from being accidentally bent or distorted.

Figure 2:
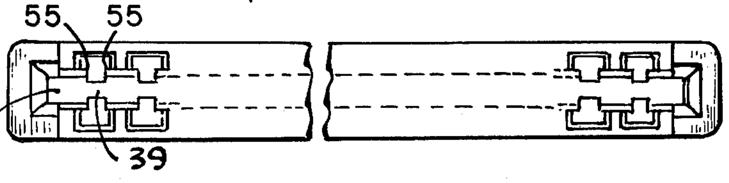
FIG. 2 is a top view of the insulator casting of FIG. 1.
Figure 3:
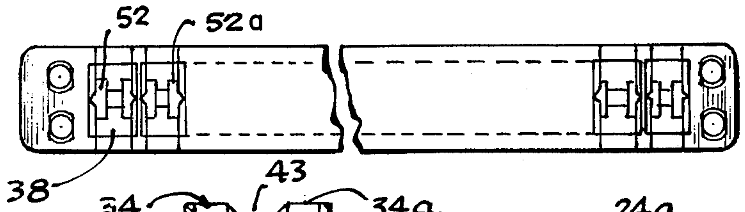
FIG. 3 is a bottom view of the insulator casting of FIG. 1.

The electrical connector element 14 of the present invention preferably is used in pairs with the connector elements 14 facing each other as illustrated in FIG. 4 of the drawings. It should be noted that this configuration may be repeated in any assembly as shown in FIGS. 1 and 2 thereby defining an assembled connector having a plurality of connector elements disposed therein.

In summary, therefore, the invention also involves the provision of a contact and insulator assembly wherein the contact may enter the insulator or casting from either the top or the bottom for assembly therewith and still provide the preloading and positioning characteristic necessary for ease of assembly.

The contact, either by itself or in pairs as noted above, initially is driven into the opening 11 of the circuit board 10. The opening 11 usually is defined by a plated opening extending through the board itself. The central base portion 18 provides an interference or press fit in the opening 11 of the board 10. This fit may, of itself, define sufficient engagement with the printed circuit portion of the board to provide an electrical connection between the contact element and the circuit board. As noted above, however, the contacts may be soldered to the board to define an electrical and mechanical interconnection therebetween. The contacts may be individually soldered or they may be exposed to wave or a flow solder techniques. In view of the fact that the present invention permits assembly without the insulator casting disposed on the contact elements higher temperature soldering techniques may be employed such as oven soldering. This technique is not available with assemblies having insulator castings mounted to the elements.

Where soldering is employed there is an advantage in assembly in that the soldered joints, after soldering, are completely exposed and may be inspected at both the top and the bottom of the circuit board. This characteristic also is not available in assemblies where the contact is first loaded into an insulator casting prior to soldering. Another advantage of the present invention resides in the ease of cleaning the soldered assembly after soldering. Since both sides of the board are exposed and an insulator casting is not in the way cleaning is a relatively easy task and flux residue or cleaning solution may readily be removed from the board. Also, there is no prospect of this material being trapped between the insulator casting and the circuit board.

It should be noted that some insulator casting materials are highly susceptible to damage from the cleaning solvent used in cleaning the boards after soldering. This problem is avoided by not having the insulator castings on the circuit board during the cleaning operation.

As noted above, the insulator casting is assembled over the contact elements after the contact elements are fixed and soldered to the circuit board—if soldering is employed, or after they are pressed into the board if that method is used.

The insulator casting is shown positioned over the contact elements in FIG. 4 prior to the assembly of the insulator casting to the contact elements. As shown in FIG. 4 the tail portions of the contact elements are disposed toward each other and in contact in a preloaded condition.

The tapered portion 40 of as described above the insulator casting 30 is adapted to flexibly separate the opposed tail sections 24 and blades 22 of the contact elements 14, as illustrated in greater detail in FIG. 7 of the drawings. The tail sections are held in spaced relation by the center element 38 of the casting until the tail sections 24 and contact engaging surface 25 pass beyond the terminal edge 39 of the center element 30 as the casting 38 is moved over the pair of contact elements 14.

When the tail sections 24 move pass the terminal edge 39 they again flex toward each other with lateral movement being restrained by the ears 26 and **26*a* moving against the interior surface of the opening 34-34a by shoulders 55 defined in the insulator casting 30. This action positions the contact engaging surfaces 25** with a proper gap therebetween and preloads them.

Further insertion of the insulator 30 results in movement of the bottom walls 36-36a against the shoulders **20-20*a* on the contact 14. This interference with mating portions in the insulator casting 30 defines sufficient gripping force to hold the insulator casting 30 securely in place over the contact elements 14.**

It should be noted that the design of the insulator casting 30 and mating contact element 14 is provided so that the contact elements 14 may be replaced by forcing them upwardly through the casting 30. This action may be realized by pushing on the section 16 on the opposite side of the printed circuit board 10 to move the contact element 14 out of the insulator casting 30. A replacement contact element 14 then may be placed back into the vacated opening in the insulator casting 30 and inserted back into its fully seated position.

While I have shown and described a specific embodiment of the present invention it will, of course, be understood that other modifications and alternative constructions may be used without departing from the true spirit and scope of this invention. I therefore intend by the appended claims to cover all such modifications and alternative constructions as fall within their true spirit and scope.

What I intend to claim and desire to secure by Letters Patent of the United States is:

1. A printed circuit board edge connector assembly for use with a mating printed circuit board and mounted on a printed circuit board comprising;

a plurality of elongated connector elements each comprising; a base press fitted in an opening in a printed circuit board and a contact blade connected to the base said contact blade extending generally upwardly from the printed circuit board and terminating in a free end; and an insulator casting having a chamber with a first end and a second end, said insulator removeably mounted at the first end by frictional emgagement on the contact blade with said connector element holding the insulator casting securely to the printed circuit board, and said second end receiving the free end of said contact blade and adapted to removeably receive, edgewise, the mating printed circuit board so as to ensure electrical connection between the contact blades and the mating printed circuit board;

the insulator casting having integral means at said first end for releasably spring biasing the contact blade of each connector element during assembly of the insulator casting over the connector elements and the second end of said insulator casting having means cooperating with the free end of said contact blade for maintaining the spring biasing of the contact blades in a preloaded position as said blade passes beyond said integral means for releasably spring biasing.

2. An electrical connector assembly as recited in claim 1 further comprising a shoulder on each of said connector elements larger than the opening in the printed circuit board for limiting the depth of insertion of the base in the printed circuit board, and where the shoulder is in frictional engagement with the first end of the insulator casting chamber thereby removably securing the contact element.

3. An electrical connector assembly for use with a mating printed circuit board comprising;

a printed circuit board having a plurality of electrical contact receiving openings therein;

an elongated electrical contact received in each of the contact receiving openings; each contact having a neck extending below the printed circuit board, a central base extending from the neck and in press fit relationship with the wall of the contact receiving opening; a shoulder portion extending from the central base and above and adjacent the printed circuit board, the shoulder portion being wider than the central base; a relatively resilient contact blade extending from the shoulder portion said contact blade extending generally upwardly from the printed circuit board and, initially, angularly away from the longitudinal axis of the central base, and then distant from the shoulder portion, extending back toward the longitudinal axis of the contact to present a convex surface, the contact blade being bifurcated and terminating in a free end tail element; and an insulator casting mounted on the contact elements, the insulator casting having a body and internal sides defining two adjacent rows of chambers receiving the contacts in opposed pairs, the chambers each having a first end and a second end with the chambers of each row being separated by a central projection at said second end serving to establish spring biasing of the contact blade during assembly, and having an open bottom adjacent the printed circuit board, the internal sides being in frictional engagement with the shoulder portion of the respective contact element in each chamber, and means at said second end interengageable with the free end tail element of each contact to maintain spring biasing of the blade of the contact in a direction transverse to the longitudinal axis to provide a preloading of the contact as said contact passes beyond said central projection;

the insulator casting having a top opening extending between the rows of chambers above the central projection in communication with each of the chambers for receiving edgewise said mating printed circuit board for electrical engagement of the contact blades with terminations on the mating printed circuit board; and the plurality of respective contacts, contact receiving openings, and the convex surfaces of the contacts extend into the top opening of the insulator casting for electrical engagement with the mating printed circuit board.

4. The assembly of claim 3 wherein the means to maintain spring biasing of the blade of the contact comprises a shoulder extending parallel to the longitudinal axis from each of the internal sides associated with each chamber to present an opposed pair of such shoulders in each chamber, and ears extending on each side of the free end tail element of the contact whereby the ears rest against the shoulders to maintain the contact in the preloaded condition.

5. The assembly of claim 3 wherein the chamber for receiving each contact is open at its top for removing and replacing the contact.

6. A method of making an edge connector for a printed circuit board comprising;

press fitting elongated contacts into at least one row of holes in a printed circuit board, the contacts having a casting engaging means adjacent the printed circuit board and a blade portion extending from the casting engaging means, said blade portion terminating in a free end;

pushing an insulator casting having discrete contact receiving chambers open at the bottom down over the contacts until the bottom of the casting is adjacent the printed circuit board;

spring biasing contact blades of the contacts into a preloaded position while pushing the insulator casting over the contacts by contact of the contact blades with means integral with the insulator casting, said integral means being located at the bottom of the insulator casting;

frictionally engaging the internal sides of the insulator casting with the casting engaging means of the contact as the casting bottom becomes adjacent the printed circuit board; and maintaining the blades in the preloaded position as said blades pass beyond said integral means by contact of said free ends with surface portions of said insulator casting, said surface portions being located adjacent the top of said insulator casting.

7. An electrical connector assembly for use with a mating printed circuit board comprising;

a printed circuit board having a plurality of electrical contact receiving openings therein;

an elongated electrical contact element received in each of the contact receiving openings; each contact comprising a base portion extending into and being secured in the contact receiving holes;

an engagement portion of the contact element extending from the base portion above and adjacent the printed circuit board having means for frictional engagement with internal surfaces of an insulator casting;

a relatively resilient central contact blade portion extending upward from the engagement portion, and terminating in a free end tail element;

an insulator casting mounted on the contact elements, the insulator casting having a first end and a second end and internal surfaces in frictional engagement with the engagement portion of the respective contact element; and the insulator casting having integral means at the first end for spring biasing the central blade portions in a direction away from the top opening when the insulator casting is assembled over the contact elements; and said insulator casting also having means at the second end cooperating with the free end tail element of each contact to maintain spring biasing of the blade of the contact in a direction transverse to its longitudinal axis to provide a preloading of the contact as said contact passes beyond said integral means for spring biasing;

the insulator casting having a top opening for receiving edgewise said mating printed circuit board for electrical engagement of the contact blades with terminations on the mating printed circuit board; and the plurality of respective contact elements, being arranged in at least one row and blades of the contacts extend into the top opening of the insulator casting for electrical engagement with the mating printed circuit board.

8. The assembly of claim 7 wherein the insulator casting comprises two adjacent rows of chambers adapted to receive the contacts in opposed pairs, the contact blade portions having intermediate convergent portions, the chambers of each row being separated by a central projection which extends from a point near the bottom, upwardly and of such width that it interferes with the contact blade portions during assembly of the insulator over the contacts in order to establish the spring biasing and wherein the top opening extends along the rows above the central projection, the lower end of the top opening being defined by the upper edge of the central projection.

9. The assembly of claim 8 wherein the means to maintain spring biasing of the blade of the contact comprises a shoulder extending parallel to the longitudinal axis from each of the internal sides associated with each chamber to present an opposed pair of such shoulders in each chamber, and ears extending on each side of the free end tail element of the contact whereby the ears rest against the shoulders to maintain the contact in the preloaded condition.

10. An electrical connector assembly for use with a mating printed circuit board in which individual contacts may be removed and replaced comprising;

a printed circuit board having a plurality of electrical contact receiving openings therein;

an elongated electrical contact element received in each of the contact receiving openings;

each contact comprising a base portion extending and secured in the contact receiving openings; an engagement portion extending from the base portion above and adjacent the printed circuit board having means for frictional engagement with internal sides of an insulator casting; a relatively resilient contact blade extending upward from the engagement portion, said contact terminating in a free-end;

an insulator casting mounted on the contact elements, the insulator casting having a body and internal sides defining a chamber for receiving each contact element and having an open bottom adjacent the printed circuit board, the internal sides being in frictional engagement with the engagement portion of the respective contact element in each chamber and each chamber having an open top for removing the contact therein, the insulator casting further having a top opening for receiving edgewise said mating printed circuit board for electrical engagement of the contact blades with terminations on the second printed circuit board; and the plurality of respective contacts, contact receiving openings, and chambers being arranged in at least one row and blades of the contacts extend into the top opening of the insulator casting for electrical engagement with the second printed circuit board means integral with the insulator casting at the open bottom thereof which are interengageable with the contact blade for establishing spring biasing of the contact blades of each contact element, during assembly of the insulator casting over the contact blades, the insulator casting also having means adjacent the open top thereof cooperating with the free end of each contact element for maintaining the spring biasing as said blade passes beyond said integral means for spring biasing.

11. The assembly of claim 10 wherein the insulator casting comprises two adjacent rows of chambers adapted to receive the contacts in opposed pairs, the chamber of each row being separated by a central projection arranged to interfere with the contact blade in the individual portion and to bias the blade upon assembly of the insulator casting over the contacts and wherein the top opening extends along the rows above the central projection, and the central projection is the means for establishing spring biasing of the contact blades.

12. The assembly of claim 10 wherein the means to maintain spring biasing of the contact blade comprises a shoulder extending from each of the internal sides associated with each chamber to present a pair of such shoulders in each chamber, and ears extending on each side of the terminal end of the contact blade whereby the ears rest against the shoulders to maintain the contact in the preloaded condition.

* * * * *